(12) United States Patent
Sentoku et al.

(10) Patent No.: US 7,435,984 B2
(45) Date of Patent: Oct. 14, 2008

(54) IMAGING OPTICAL SYSTEM AND EXPOSURE APPARATUS

(75) Inventors: Koichi Sentoku, Kawachi-gun (JP);
Gaku Takahashi, Utsunomiya (JP);
Hideki Ina, Toshima-ku (JP); Yoshinori Miwa, Tsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 164 days.

(21) Appl. No.: 11/456,115

(22) Filed: Jul. 7, 2006

(65) Prior Publication Data

US 2007/0007471 A1   Jan. 11, 2007

(30) Foreign Application Priority Data

Jul. 7, 2005   (JP) .............. 2005-198541

(51) Int. Cl.
*G01N 21/86* (2006.01)
(52) U.S. Cl. ...................... 250/548; 355/53
(58) Field of Classification Search ........... 250/548, 250/234, 216; 355/53, 55, 67; 356/399–401
See application file for complete search history.

(56) References Cited

U.S. PATENT DOCUMENTS 6,665,049 B1 * 12/2003 Takahashi ............ 355/53
2001/0006413 A1   7/2001 Burghoorn 2003/0081213 A1   5/2003 Oishi et al.

FOREIGN PATENT DOCUMENTS

JP      11-271604      10/1999
JP      2001-217191    8/2001

\* cited by examiner

*Primary Examiner*—Kevin Pyo
(74) *Attorney, Agent, or Firm*—Morgan & Finnegan, L.L.P.

(57) ABSTRACT

An imaging optical system for imaging a pattern of an object plane onto an image plane includes a first imaging optical system for imaging at a first imaging position, the first imaging optical system having a magnification α in a vacuum atmosphere, and a second imaging optical system for imaging at a second imaging position, the second imaging optical system having a magnification β in the vacuum atmosphere, wherein when an environment in which the imaging optical system is placed changes from the vacuum atmosphere to an air atmosphere or vise versa, a direction of the first imaging position that moves along an optical axis is opposite to a direction of the second imaging position that moves along the optical axis.

10 Claims, 8 Drawing Sheets

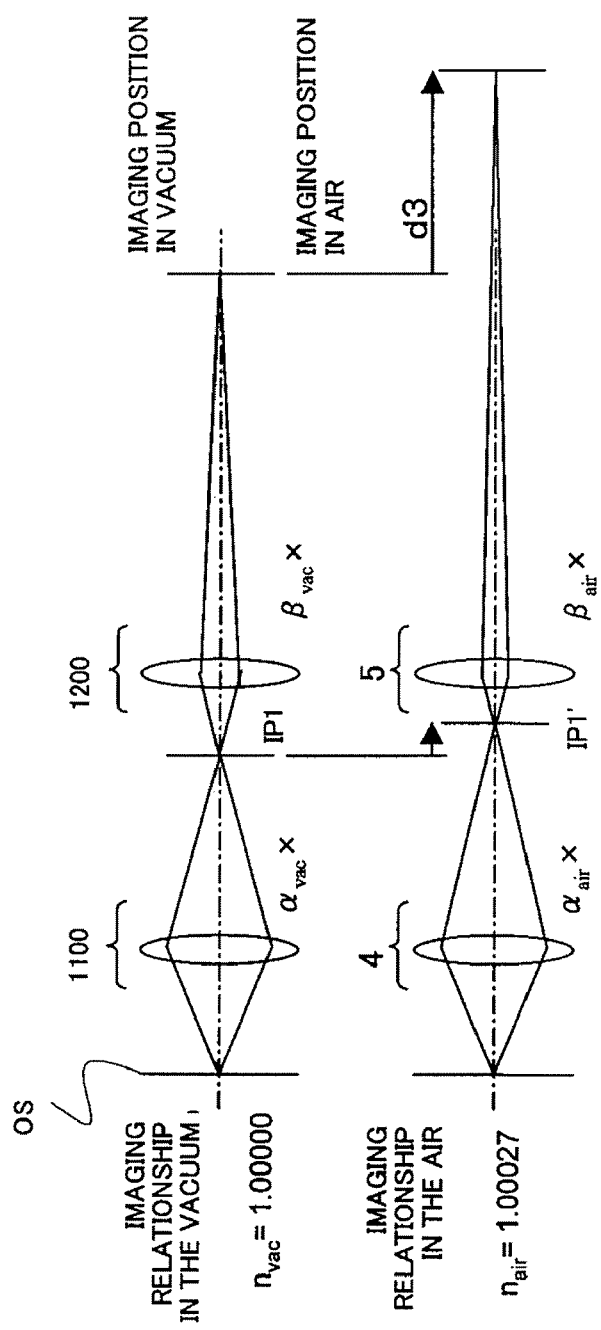

IMAGING OPTICAL SYSTEM AND
EXPOSURE APPARATUS

BACKGROUND OF THE INVENTION

The present invention relates generally to an optical system, and more particularly to a detection optical system in an exposure apparatus that exposes various plates, such as a semiconductor wafer single crystal substrate, and a liquid crystal display ("LCD") glass plate. The present invention is suitable, for example, for an optical system in an exposure apparatus that utilizes the ultraviolet ("UV") light and the extreme ultraviolet ("EUV") light as an exposure light source.

A conventional reduction projection exposure apparatus uses a projection optical system to project a circuit pattern of a mask (or a reticle) onto a wafer, etc. to transfer the circuit pattern, in manufacturing the fine semiconductor device using the photolithography technology.

The transferable minimum critical dimension (or the resolution) of the projection exposure apparatus is proportionate to a wavelength of the exposure light, and inversely proportionate to the numerical aperture ("NA") of the projection optical system. The shorter the wavelength is, the finer the resolution is. Along with the recent demands for finer processing to semiconductor devices, use of a shorter wavelength of the exposure light has been promoted in the exposure light source from an ultra-high pressure mercury lamp (i-line with a wavelength of approximately 365 nm) to a KrF excimer laser (with a wavelength of approximately 248 nm) and an ArF excimer laser (with a wavelength of approximately 193 nm). Thus, the exposure light comes to use the UV light with a shorter wavelength for the exposure light.

Nevertheless, the lithography using the UV light has the limit to satisfy the growing demands for finer processing to the semiconductor devices. An EUV exposure apparatus has been developed to effectively transfer a very fine circuit pattern of 42 nm or smaller. The EUV exposure apparatus uses the EUV light having a wavelength between 10 to 15 nm shorter than that of the UV light.

As the light becomes highly likely to be absorbed in a material as its wavelength becomes shorter. It is impractical to use a refractive element or lens, which is applicable to the visible and UV lights. There are no glass materials usable for the EUV light wave range, and a catoptric optical system that consists of reflective elements or mirrors should be used.

Since the EUV light is likely to be absorbed or attenuated in the air atmosphere, the EUV exposure apparatus should be used in the vacuum atmosphere. Accordingly, the EUV exposure apparatus houses at least an optical path that the EUV light travels in a vacuum chamber that maintains the vacuum atmosphere, preventing the attenuation of the EUV light while it is in use.

An alignment detection system and a focus position detection system do not use the EUV light, and thus can place some of the components in the air atmosphere via a glass or a viewing window that isolates the vacuum atmosphere from the air atmosphere. See, for example, Japanese Patent Application, Publication No. 2001-217191. This reference arranges, in the air atmosphere, those components which would malfunction in the vacuum atmosphere, or cause contaminants and thus cannot be arranged in the vacuum atmosphere, such as a measuring light source, an imaging sensor, and an electric circuit.

On the other hand, all or rest of such optical systems as an alignment detection system and the focus position detection system are arranged in the vacuum atmosphere. When the environment changes from the air atmosphere to the vacuum atmosphere, the refractive index of the atmosphere in which the optical system is placed varies, and a problem occurs in that the optical system fluctuates its optical characteristic. For example, when it is assumed that for the light having a wavelength of 820 nm, the refractive index of the vacuum atmosphere is 1.00000, and the refractive index of the air atmosphere is 1.00027. This variation of the refractive index influences the optical characteristic of the optical system, such as a focus position, a magnification, and a wavefront aberration.

In general, the optical system to be arranged in the vacuum atmosphere is assembled and adjusted in the air atmosphere. More specifically, a change of the optical characteristic caused by the environmental change, such as an imaging-position changing amount, is previously obtained and adjusted in the air atmosphere. However, the imaging position does not always change by the changing amount as previously calculated due to assembly and adjustment errors or working errors of the optical element, such as scattering of a radius of curvature, a thickness and a glass optical constant of the lens. The optical characteristics of the alignment detection system and focus position detection optical system are likely to remarkably deteriorate in the vacuum atmosphere. In other words, the highly precise detection is precluded when the optical characteristic greatly varies due to the environmental change. Accordingly, an optical system in which its optical characteristic is less likely to change due to the environmental change is proposed. See, for example, Japanese Patent Application, Publication No. 11-271604.

Although this reference discloses an optical system in which the optical characteristic is less likely to change due to the environmental change, the optical system has an infinite object distance. No optical systems or power arrangements having a finite object distance are disclosed. For example, in an attempt to use the optical system disclosed in this reference to configure an optical system that has a finite object distance and the optical characteristic less likely to change the environmental change, two pairs of optical systems having an infinite object distance of this reference should be arranged so that the infinite object side of each optical system can oppose to each other. In addition, these optical systems should be designed to withstand the environmental change. Problematically, the overall length of the optical system would be long, and the number of lenses would increase.

It is conceivable to use a vacuum chamber to adjust the optical system, to measure the optical characteristic change (such as an imaging-position changing amount) in the vacuum atmosphere, and to adjust the air atmosphere based on the measurement result. However, this scheme would be time-consuming and costly, and require complex adjustment faculties.

BRIEF SUMMARY OF THE INVENTION

The present invention is directed to an imaging optical system and exposure apparatus, which can reduce the optical characteristic fluctuation to the environmental change while maintaining a simple structure.

An imaging optical system according to one aspect of the present invention for imaging a pattern of an object plane onto an image plane includes a first imaging optical system for imaging at a first imaging position, the first imaging optical system having a magnification α in a vacuum atmosphere, and a second imaging optical system for imaging at a second imaging position, the second imaging optical system having a magnification β in the vacuum atmosphere, wherein when an environment in which the imaging optical system is placed changes from the vacuum atmosphere to an air atmosphere or vise versa, a direction of the first imaging position that moves along an optical axis is opposite to a direction of the second imaging position that moves along the optical axis.

An imaging optical system according to another aspect of the present invention for imaging a pattern of an object plane onto an image plane includes a first lens unit having a positive refractive index, and including a first positive lens with a plane facing the object plane, a second positive lens with a convex surface facing the object plane, a third negative lens with a concave surface facing the object plane, a forth positive lens with a convex surface facing the object plane, and a fifth negative lens with a concave surface facing the object plane, and a second lens unit including a sixth positive lens with a plane facing the object plane, a seventh meniscus negative lens with a convex surface facing the object plane, and an eighth positive lens with a convex surface facing the object plane.

An imaging optical system according to still another aspect of the present invention for imaging a pattern of an object plane onto an image plane includes a first imaging optical system for forming an intermediate image of the pattern of the object surface, and a second imaging optical system for imaging the intermediate image, wherein when a refractive index of an atmosphere in which the first and second imaging optical systems are placed changes and one of the first and second imaging optical systems has a longer overall distance (object-image distance), the other of the first and second imaging optical systems has a shorter overall distance.

An exposure apparatus according to another aspect of the present invention for exposing a plate using a pattern of a mask and a light from a light source includes a first detection optical system for detecting a surface position of the plate, and a second detection optical system for detecting a relative position between the mask and the plate, wherein at least one of the first and second detecting optical systems includes the above imaging optical system.

BRIEF DESCRIPTION OF THE DRAWINGS

FIG. 10 is a view for explaining an imaging position change relative to the environmental change of an imaging optical system.

DETAILED DESCRIPTION OF THE PREFERRED EMBODIMENTS

Figure 1:
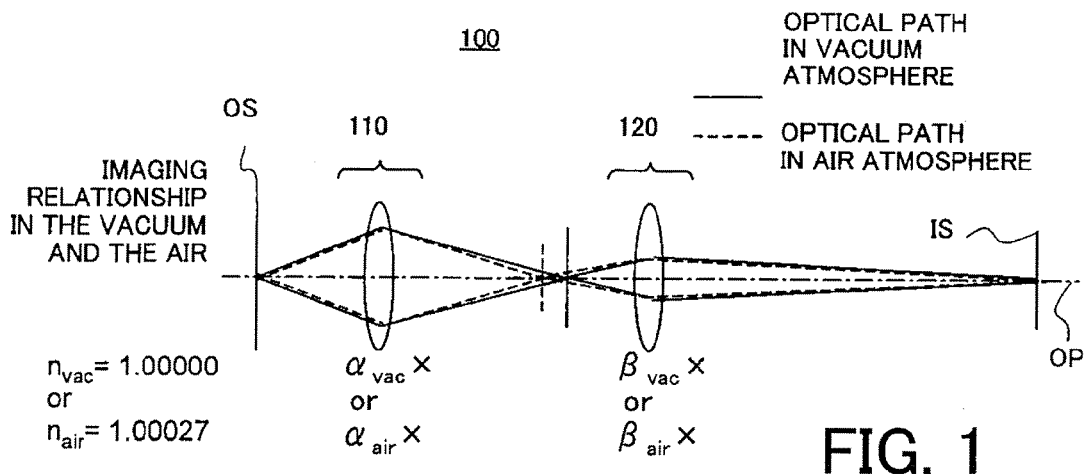
FIG. 1 is a schematic sectional view showing a structure of an imaging optical system according to one aspect of the present invention.

Referring now to the accompanying drawings, a description will be given of an imaging optical system according to one aspect of the present invention. In each figure, corresponding elements are designated by the same reference numerals, and a description thereof will be omitted. In this application, a lens unit covers both a single lens and plural lenses.

Referring now to FIGS. 10A and 10B, a description will be given of an imaging-position change when the environment in which an imaging optical system 1000 is placed changes from the air atmosphere to the vacuum atmosphere or vise versa. The following description refers to changes both from the vacuum atmosphere to the air atmosphere and from the air atmosphere to the vacuum atmosphere as an environmental change. Here, FIGS. 10A and 10B are views for explaining the image-position change of the imaging optical system 1000 to the environmental change. More specifically, FIG. 10A shows an imaging relationship in the vacuum atmosphere. FIG. 10B shows an imaging relationship in the air atmosphere.

A refractive index $n_{air}$ in the air atmosphere is 1.00027 when a refractive index $n_{vac}$ is 1.00000 in the vacuum atmosphere. As shown in FIG. 10, the imaging optical system 1000 includes a first imaging optical system 1100 that has a magnification α and is located near an object plane OS, and a second imaging optical system 1200 that has a magnification β and is located near an image plane IS. Hence, the magnification of the imaging optical system 1000 is defined as α×β.

When the environment in which the imaging optical system 1000 is placed changes from the vacuum atmosphere to the air atmosphere, an imaging position IP1 of the first imaging optical system 1100 moves to an imaging position IP1'. An imaging position of the second optical system 1200 also changes. As a result, a position of the final imaging plane of the imaging optical system 1000 changes by a changing amount d3 between the vacuum atmosphere and the air atmosphere. The changing amount d3 remarkably increases when the imaging positions of the first and second imaging optical systems 1100 and 1200 change in the same direction due to the environmental change.

On the other hand, the imaging optical system 100 according to one aspect of the present invention can reduce or eliminate the changing amount d3 of the position of the final imaging plane relative to the environmental change down to a small value, as shown in FIG. 1. FIG. 1 is a schematic sectional view showing a structure of the imaging optical system 100. In FIG. 1, a solid line denotes an optical path in the imaging optical system 100, and a broken line denotes an optical path in the air atmosphere. The imaging optical system 100 can image the light from the object plane OS onto the image plane IS.

Next follows a reason why the imaging optical system 100 can reduce the changing amount d3 to an extremely small value. Again, the refractive index $n_{air}$ in the air atmosphere is 1.00027 when the refractive index $n_{vac}$ is 1.00000 in the vacuum atmosphere. As shown in FIG. 1, the imaging optical system 100 includes a first imaging optical system 110 that has a magnification a and is located near the object plane OS, and a second imaging optical system 120 that has a magnification β and is located near the image plane IS. Thus, the magnification of the imaging optical system 100 is defined as α×β.

Figure 2A:
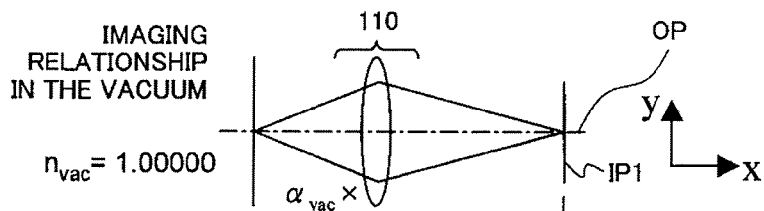
FIG. 2 is a view for explaining an imaging-position change relative to the environmental change of a first imaging optical system shown in FIG. 1.
Figure 2B:
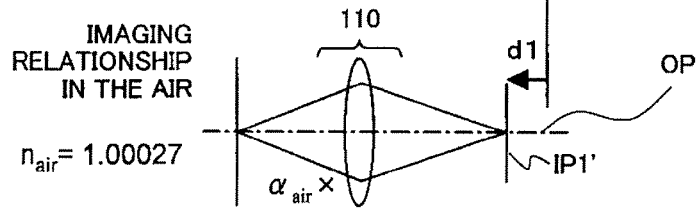
Figure 3A:
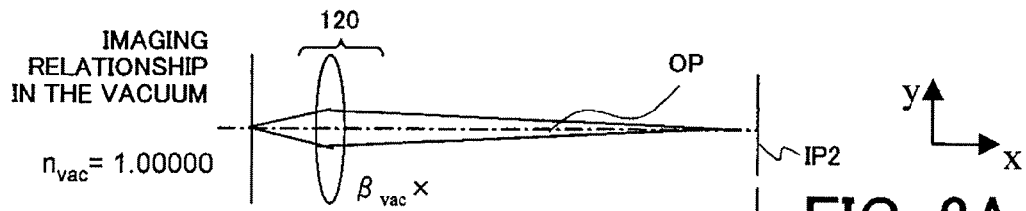
FIG. 3 is a view for explaining an imaging-position change relative to the environmental change of a second imaging optical system shown in FIG. 1.
Figure 3B:
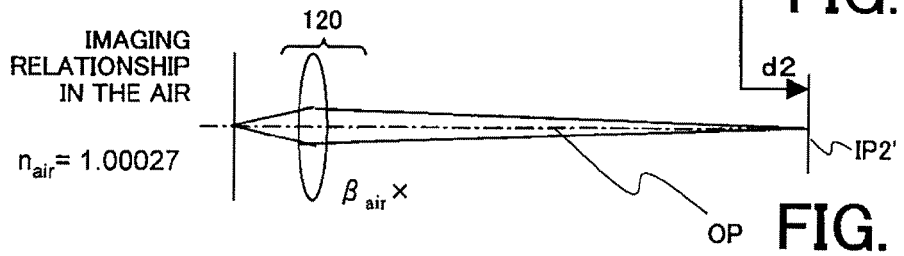

In the first imaging optical system 110, when the environment changes from the vacuum atmosphere to the air atmosphere, its (first) imaging position IP1 moves to the imaging position IP1' by d1 in the −x direction along the optical axis, as shown in FIG. 2, under influence of the refractive index change. Here, FIGS. 2A and 2B are views for explaining the image-position change of the imaging optical system 110 to the environmental change. More specifically, FIG. 2A shows an imaging relationship in the vacuum atmosphere. FIG. 2B shows an imaging relationship in the air atmosphere.

The second imaging optical system 120 is influenced by a refractive index change when the environment changes from the vacuum atmosphere to the air atmosphere. A (second) imaging position IP2 of the second imaging optical system 120 moves an imaging position IP2' by d2 in the +x direction.

Thus, the imaging optical system 100 includes the first and second imaging optical systems 110 and 120 in which their imaging positions move in different directions due to the environmental change. Thereby, the imaging position change of the first imaging optical system 110 cancels out the imaging position change of the second imaging optical system 120. The first and second imaging optical systems 110 and 120 are designed so that the imaging-position changing amount d1 of the first imaging optical system 110 and the imaging-position changing amount d2 of the second imaging optical system 120 approximately satisfy Equation 2 below. This design reduces the changing amount d3 of the position of the final imaging plane of the imaging optical system 100 down to an extremely small value. The design uses such a simulation that the radius of curvature, thickness, interval, glass material's refractive index and dispersive power of a lens in the each of the imaging optical systems 110 and 120 approximately satisfy Equation 2 below. When both of the imaging-position changing amount d1 of the first imaging optical system 110 and the imaging-position changing amount d2 of the second imaging optical system 120 are made zero, an optical system that never changes a position of its final imaging plane relative to the environmental change can be configured.

The imaging optical system 100 satisfy Equation 1 below where d3 is the changing amount of the imaging position relative to the environmental change, and DOF is a depth of focus:

$$-DOF < d3 < DOF \quad \text{[EQUATION 1]}$$

DOF is defined as $2 \times \lambda \times (1/2NA_{IMG})^2$ where $\lambda$ is a wavelength of the light used for the imaging optical system 100, and $NA_{IMG}$ is a numerical aperture of the imaging optical system 100 at the image plane side.

The imaging-position changing amount d1 of the first imaging optical system 110 and the imaging-position changing amount d2 of the second imaging optical system 120 approximately satisfy Equation 2 below:

$$||d1|-|d2| \times \alpha^2/(\alpha \times \beta)^2 = 0 \quad \text{[EQUATION 2]}$$

The changing amount d3 can have a variable tolerance is variable according to the required optical characteristic, and may be selected, for example, between ±DOF/2 and ±DOF/10. The tolerance of the left side in Equation 2 may be set from the depth of focus calculated from the entire optical system.

Table 1 shows lens data of the imaging optical system 100.

The imaging optical system 100 has a refractive index $nd_{air}$ of 1.00027 to the d-line in the air atmosphere, and a refractive index $nd_{vac}$ of 1.00000 to the d-line in the vacuum atmosphere. The refractive index and Abbe number in the lens data shown in Table 1 are numerical values to the d-line. A composite focal length f of −9.6332 and a magnification of 27 times are values to a wavelength $\lambda$ of 820 nm used for the actual optical design. Other specifications include an image-plane numerical aperture $NA_{img}$ of 0.0006 and an F-number of Fno of 773.5. In Table 1, r denotes a radius of curvature, d denotes a lens surface separation or interval, n denotes a lens's refractive index, and v denotes a lens's Abbe number. Numbers associated with each of r, d, n and v denote a plane number from the object plane to the image plane:

TABLE 1

| | | | |
|---|---|---|---|
| r1 = ∞ | d1 = 97.0000 | nd1 = 1.00000 | OBJECT PLANE |
| r2 = ∞ | d2 = 63.3500 | nd2 = 1.51633 | vd2 = 64.1 |
| r3 = ∞ | d3 = 50.0000 | nd3 = 1.00000 | |
| r4 = ∞ | d4 = 5.5000 | nd4 = 1.70000 | vd4 = 48.1 |
| r5 = −132.1073 | d5 = 191.6043 | nd5 = 1.00000 | |
| r6 = ∞ | d6 = 38.3957 | nd6 = 1.00000 | STOP |
| r7 = 107.1700 | d7 = 5.0000 | nd7 = 1.63854 | vd7 = 55.4 |
| r8 = −69.3428 | d8 = 2.1000 | nd8 = 1.00000 | |
| r9 = −29.3717 | d9 = 3.0000 | nd9 = 1.48749 | vd9 = 70.2 |
| r10 = 54.9626 | d10 = 3.3000 | nd10 = 1.00000 | |
| r11 = 127.7580 | d11 = 5.0000 | nd11 = 1.74400 | vd11 = 44.8 |
| r12 = −31.1992 | d12 = 3.0000 | nd12 = 1.00000 | |
| r13 = −38.0253 | d13 = 1.5000 | nd13 = 1.51742 | vd13 = 52.4 |
| r14 = 101.8728 | d14 = 4.5000 | nd14 = 1.00000 | |
| r15 = ∞ | d15 = 5.0000 | nd15 = 1.51633 | vd15 = 64.1 |
| r16 = ∞ | d16 = 3.0000 | nd16 = 1.00000 | |
| r17 = ∞ | d17 = 10.0000 | nd17 = 1.51633 | vd17 = 64.1 |
| r18 = ∞ | d18 = 337.2491 | nd18 = 1.00000 | |
| r19 = ∞ | d19 = 13.9081 | nd19 = 1.00000 | |
| r20 = ∞ | d20 = 4.0000 | nd20 = 1.74400 | vd20 = 44.8 |
| r21 = −24.5481 | d21 = 1.7000 | nd21 = 1.00000 | |
| r22 = 50.7748 | d22 = 2.5000 | nd22 = 1.48749 | vd22 = 70.2 |
| r23 = 48.7204 | d23 = 5.0000 | nd23 = 1.00000 | |
| r24 = 16.5623 | d24 = 5.0000 | nd24 = 1.48749 | vd24 = 70.2 |
| r25 = −889.4372 | d25 = 7.0000 | nd25 = 1.00000 | |
| r26 = ∞ IMAGE PLANE | d26 = 264.6794 | nd26 = 1.00000 | |

The imaging optical system 100 pursuant to the lens data shown in Table 1 includes, for example, a first imaging optical system 110 having a magnification of −2 times, and a second imaging optical system 120 having a magnification of −13.5 times. Thus, the imaging optical system 100 has a composite magnification of 27 times. In Table 1, the first imaging optical system 110 corresponds to an optical system including elements r1 to r18, and the second imaging optical system 120 corresponds to an optical system including elements r19 to r26. When the environment changes from the vacuum atmosphere to the air atmosphere, a changing amount is −0.014 mm between an imaging position of the first imaging optical system in the vacuum atmosphere and that in the air atmosphere. A changing amount is +2.618 mm between an imaging position of the second imaging optical system in the vacuum atmosphere and that in the air atmosphere. The imaging optical system 100 having the lens data shown in Table 1 exhibits a changing amount of 0.09 mm to the environmental change, which is much smaller than a depth of focus $DOF_1$, given in Equation 3. In other words, the imaging optical system 100 having the lens data shown in Table 1 has a reduced imaging-position changing amount to the environmental change, and maintains the optical characteristic fluctuation small.

$$DOF_1 = 2 \times \lambda \times (Fno)^2 = 2 \times 0.82 \ \mu m \times 773.5^2 = 981.2 \ mm \quad \text{[EQUATION 3]}$$

An imaging-position changing amount of the imaging optical system 100 is thus restrained within a predetermined range when the environment changes in which the imaging optical system 100 is placed. The magnification of the imaging optical system 100 having the lens data shown in Table 1 is, for example, 27 times in the vacuum atmosphere and 26.97 in the air atmosphere. The imaging optical system 100 can reduce the optical characteristic fluctuation to the environmental change when satisfying Equation 4 below, where $(\alpha_{vac} \times \beta_{vac})$ is a magnification of the imaging optical system 100 in the vacuum atmosphere, and $(\alpha_{air} \times \beta_{air})$ is a magnification of the imaging optical system in the air atmosphere:

$$-|\alpha_{vac} \times \beta_{vac}|/10 \leq (\alpha_{vac} \times \beta_{vac}) - (\alpha_{air} \times \beta_{air}) \leq |\alpha_{vac \times \beta}|/10$$

In the imaging plane of the imaging optical system 100 having the lens data shown in Table 1, both a wavefront aberration $WA_{vac}$ in the vacuum atmosphere and a wavefront aberration $WA_{air}$ are 0.271λ. In other words, the wavefront aberration does not change in the imaging optical system 100 before and after the environmental change occurs. Therefore, the imaging optical system 100 can form an optical system that has no wavefront aberration when satisfying the tolerance of the wavefront aberration given in Equation 5 below:

$$|WA_{vac}| \leq \lambda/4 \text{ and } |WA_{air}| \leq \lambda/4 \quad \text{[EQUATION 5]}$$

Figure 4:
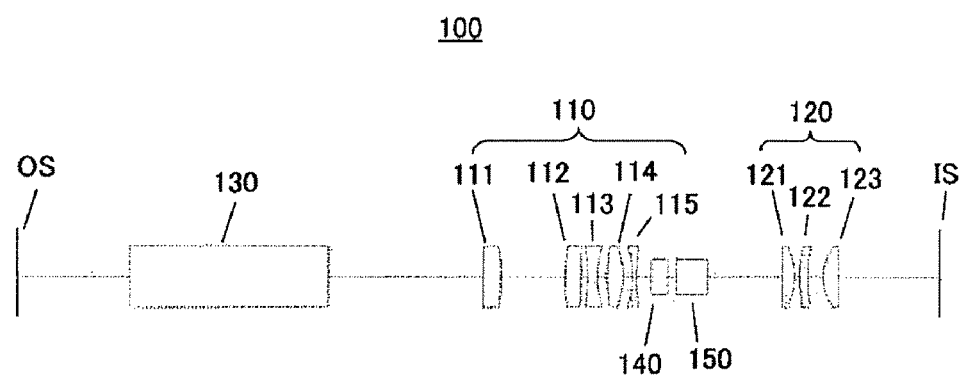
FIG. 4 is a schematic sectional view showing a concrete lens structure in the imaging optical system shown in FIG. 1.

FIG. 4 is a schematic sectional view showing a concrete lens configuration of the imaging optical system 100. As shown in FIG. 4, the imaging optical system 100 includes a first imaging optical system (or first lens unit) 110 that has a positive refractive index, and a second imaging optical system (or second lens unit) 120.

The first imaging optical system 110 includes a first positive lens 111 having a plane facing the object plane OS, a second positive lens 112 having a convex surface facing the object plane OS, a third negative lens 113 having a concave surface facing the object plane OS, a fourth positive lens 114 having a convex surface facing the object plane OS, and a fifth negative lens 115 having a concave surface facing the object plane OS.

The second imaging optical system 120 includes a sixth positive lens 121 having a plane facing the object plane OS, and a seventh negative meniscus lens 122 having a convex surface facing the object plane OS, and an eighth positive lens 123 having a convex surface facing the object plane OS.

As shown in FIG. 4, the imaging optical system 100 arranges a prism 130 between the object plane OS and the first imaging optical system 110, and plane-parallel plates 140 and 150 between the first and second imaging optical systems 110 and 120.

As discussed, this embodiment designs the first and second imaging optical systems 110 and 120 such that when the refractive index of the atmosphere changes, the overall distance (object-image distance) of one of them becomes longer while the object-image distance of the other becomes shorter. This configuration can reduce a change of the overall distance of the imaging optical system 100 when the refractive index of the atmosphere changes.

Taking the refractive-index fluctuation due to the environmental change into account, Table 2 shows other lens data of the imaging optical system 100 in which the imaging position does not change even when the environmental change occurs.

The specification of the imaging optical system 110 includes a composite focal length f of 198.24 of the entire system, a magnification α of 2 to a wavelength λ of 820 nm, an image-plane numerical aperture $NA_{img}$ of 0.0087, and an F-number of Fno of 57.29. The imaging optical system 100 has a refractive index of 1.00027 in the air atmosphere, and a refractive index of 1.00000 in the vacuum atmosphere. Each symbol in Table 2 has the same definition as that in Table 1:

TABLE 2

| r1 = ∞ | d1 = 97.00 | nd1 = 1.00000 | OBJECT PLANE |
| r2 = ∞ | d2 = 63.35 | nd2 = 1.51633 | vd2 = 64.14 |

TABLE 2-continued

| r3 = ∞ | d3 = 50.00 | nd3 = 1.00000 | |
| r4 = 243.76 | d4 = 5.50 | nd4 = 1.74397 | vd4 = 44.85 |
| r5 = −343.6939 | d5 = 191.6043 | nd5 = 1.00000 | |
| r6 = ∞ | d6 = 38.3957 | nd6 = 1.00000 | STOP |
| r7 = ∞ | d7 = 5.00 | nd7 = 1.74397 | vd7 = 44.85 |
| r8 = −32.1509 | d8 = 2.10 | nd8 = 1.00000 | |
| r9 = −24.2530 | d9 = 3.00 | nd9 = 1.48749 | vd9 = 70.41 |
| r10 = 28.4000 | d10 = 3.30 | nd10 = 1.00000 | |
| r11 = 36.3941 | d11 = 5.00 | nd11 = 1.74397 | vd11 = 44.85 |
| r12 = −44.4537 | d12 = 3.00 | nd12 = 1.00000 | |
| r13 = −60.5452 | d13 = 1.50 | nd13 = 1.74335 | vd13 = 28.08 |
| r14 = 63.36834 | d14 = 4.50 | nd14 = 1.00000 | |
| r15 = ∞ | d15 = 5.00 | nd15 = 1.51633 | vd15 = 64.14 |
| r16 = ∞ | d16 = 3.00 | nd16 = 1.00000 | |
| r17 = ∞ | d17 = 10.00 | nd16 = 1.51633 | vd17 = 64.14 |
| r18 = ∞ | d18 = 0.00 | nd17 = 1.00000 | |
| r19 = ∞ | d19 = 330.04 | nd18 = 1.00000 | |
| IMAGE PLANE | | | |

The imaging optical system 110 pursuant to the lens data shown in Table 2 reveals a very small imaging-position changing amount of about 1.4 μm to the environmental change, and may arrange plural imaging optical systems that are less likely to change the optical characteristic.

As discussed above, even when the environment changes from the air atmosphere to the vacuum atmosphere or vice versa, the imaging optical system 100 can maintain the optical characteristic fluctuation small. The imaging optical system 100 when applied, for example, to the alignment detection system and focus position detection system, can provide highly precise detections in both the vacuum atmosphere and air atmosphere.

For reference, Table 3 shows lens data of an imaging optical system having an optical characteristic, in particular, an imaging position, which is highly likely to fluctuate relative to the environmental change. The imaging optical system has a refractive index $nd_{air}$ of 1.00027 to the d-line in the air atmosphere, and a refractive index $nd_{vac}$ of 1.00000 to the d-line in the vacuum atmosphere. The refractive index and Abbe number in the lens data shown in Table 3 are numerical values to the d-line. A composite focal length f of −12.412 of the entire imaging optical system and a magnification of 27 are values to a wavelength λ of 820 nm used for the actual optical design. Other specifications include an image-plane numerical aperture $NA_{img}$ of 0.0006 and an F-number of Fno of 515.3. Each symbol in Table 3 has the same definition as that in Table 1:

TABLE 3

| r1 = ∞ | d1 = 0.0000 | nd1 = 1.00000 | OBJECT PLANE |
| r2 = ∞ | d2 = 97.0000 | nd2 = 1.00000 | |
| r3 = ∞ | d3 = 63.3500 | nd3 = 1.51633 | vd3 = 64.1 |
| r4 = ∞ | d4 = 50.0000 | nd4 = 1.00000 | |
| r5 = ∞ | d5 = 5.0000 | nd5 = 1.60311 | vd5 = 60.7 |
| r6 = 30.0015 | d6 = 6.0000 | nd6 = 1.00000 | |
| r7 = 37.6822 | d7 = 6.0000 | nd7 = 1.49700 | vd7 = 81.6 |
| r8 = −77.6918 | d8 = 213.0000 | nd8 = 1.00000 | |
| r9 = ∞ | d9 = 14.9987 | nd9 = 1.00000 | |
| r10 = ∞ | d10 = 32.1309 | nd10 = 1.00000 | |
| r11 = 80.7154 | d11 = 7.0000 | nd11 = 1.51633 | vd11 = 64.1 |
| r12 = 50.6051 | d12 = 5.0000 | nd12 = 1.00000 | |
| r13 = −65.4325 | d13 = 6.0000 | nd13 = 1.49700 | vd13 = 81.6 |
| r14 = −41.2342 | d14 = 5.0000 | nd14 = 1.00000 | |
| r15 = 488.9258 | d15 = 6.0000 | nd15 = 1.60562 | vd15 = 43.7 |
| r16 = ∞ | d16 = 167.0314 | nd16 = 1.00000 | |
| r17 = ∞ | d17 = 168.6186 | nd17 = 1.00000 | |
| r18 = ∞ | d18 = 5.0000 | nd18 = 1.51633 | vd18 = 64.1 |
| r19 = ∞ | d19 = 50.0000 | nd19 = 1.00000 | |
| r20 = ∞ | d20 = 10.0000 | nd20 = 1.51633 | vd20 = 64.1 |
| r21 = ∞ | d21 = 100.0000 | nd21 = 1.00000 | |

TABLE 3-continued

| | | | |
|---|---|---|---|
| r22 = ∞ | d22 = 10.0000 | nd22 = 1.51633 | vd21 = 64.1 |
| r23 = ∞ | d23 = 173.5000 | nd23 = 1.00000 | |
| r24 = ∞ | d24 = 61.4669 | nd24 = 1.00000 | |
| r25 = ∞ | d25 = 24.1926 | nd25 = 1.00000 | |
| r26 = 65.5000 | d26 = 6.0000 | nd26 = 1.77250 | vd26 = 49.6 |
| r27 = −65.5000 | d27 = 1.0000 | nd27 = 1.00000 | |
| r28 = 32.5800 | d28 = 4.0000 | nd28 = 1.80518 | vd28 = 25.4 |
| r29 = −47.7900 | d29 = 4.0000 | nd29 = 1.00000 | |
| r30 = −25.0000 | d30 = 5.0000 | nd30 = 1.77250 | vd30 = 49.6 |
| r31 = −107.5394 | d31 = 50.2248 | nd31 = 1.00000 | |
| IMAGE PLANE | | | |

The image position of the imaging optical system having the lens data changes by about 1.5 mm, greatly deviating from and the depth of focus calculated as $2 \times \lambda \times (Fno)^2$ when the environmental change occurs. In other words, the imaging optical system having the lens data shown in Table 3 remarkably deteriorates its optical characteristic when the environmental change occurs. Therefore, for example, an alignment detection system and a focus position detection system using it in the vacuum environment for the EUV exposure apparatus cannot provide high precise detections.

Figure 5:
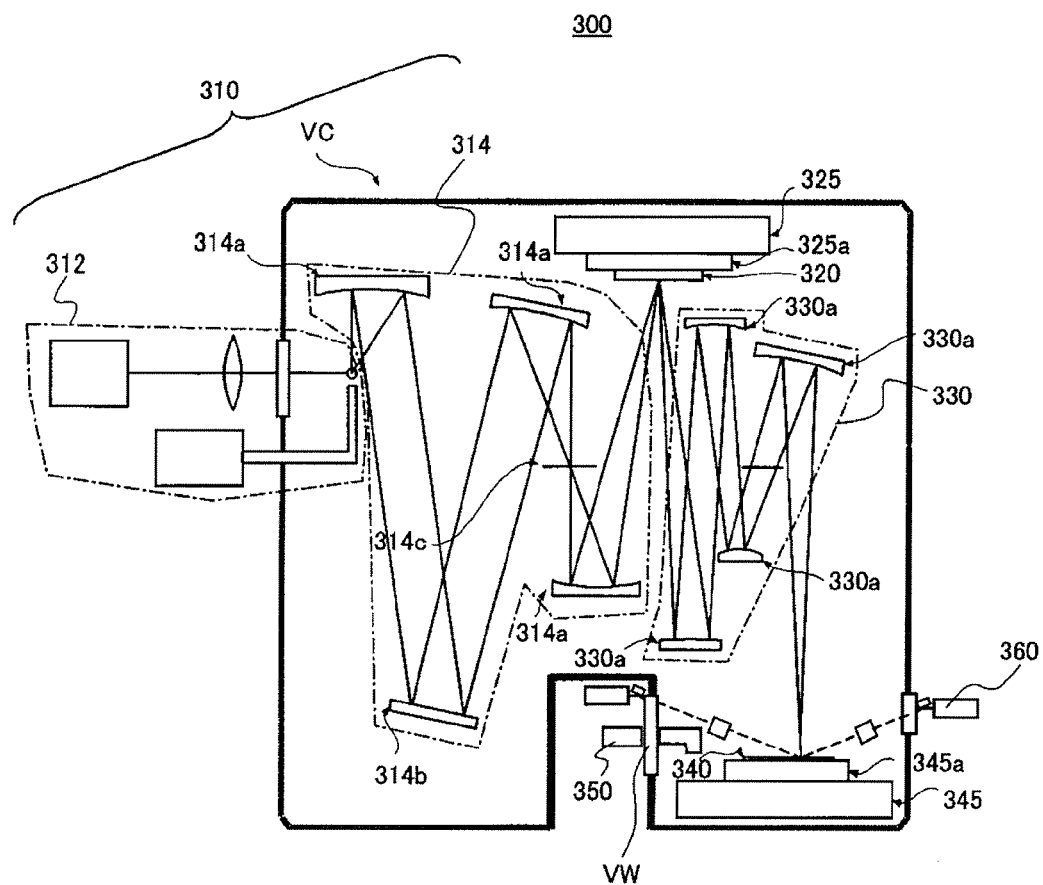
FIG. 5 is a schematic sectional view showing a structure of an exposure apparatus according to one aspect of the present invention.

Referring now to FIG. 5, a description will be given below of an exposure apparatus 300 that utilizes the imaging optical system 100. Here, FIG. 5 is a schematic sectional view of the exposure apparatus 300 according to one aspect of the present invention.

The exposure apparatus 300 is a projection exposure apparatus that uses EUV light (with a wavelength of, e.g., 13.4 nm) as an exposure light, and exposes onto a plate 340 a pattern of a mask 320 in a step-and-scan manner.

The exposure apparatus 300 includes, as shown in FIG. 5, an illumination apparatus 310, a mask stage 325 that supports a mask 320, a projection optical system 330, a wafer stage 345 that supports a plate 340, an alignment detection system 350, and a focus position detection system 360.

As shown in FIG. 5, at least the optical path through which the EUV light travels is maintained in a vacuum atmosphere VC, since the EUV light has a low transmittance to air and generates contaminants in reaction with a residue gas, such as a polymer organic gas. The degree of vacuum of the vacuum atmosphere VC is about $10^{-5}$ Pa to $10^{-4}$ Pa in this embodiment.

The illumination apparatus 310 uses the EUV light having an arc shape corresponding to an arc field of the projection optical system 330 to illuminate the mask 320, and includes an EUV light source 312 and an illumination optical system 314.

The EUV light source 310 uses, for example, a laser plasma light source. The laser plasma light source irradiates a highly intensified pulse laser beam to a target material in a vacuum chamber, inducing high-temperature plasma for use as the EUV light emitted from this. The target material may use a metallic thin film, a jet of gas, and liquid droplets, etc. The pulse laser preferably has a high repetitive frequency, and is usually driven at the repetitive frequency of several kHz so as to increase the average intensity of the emitted EUV light.

The illumination optical system 314 includes condenser mirrors 314a and an optical integrator 314b. The condenser mirror 314a serves to condense the EUV light that is radiated approximately isotropically from the laser plasma. The optical integrator 314b uniformly illuminates the mask 320 with a predetermined aperture. The illumination optical system 312 further includes an aperture 314c at a position conjugate with the mask 320, and the aperture 314c limits the illumination area of the mask 320 to an arc shape.

The mask 320 is a reflection mask, and has a circuit pattern (or image) to be transferred. It is supported and driven by the reticle stage 325. The diffracted light emitted from the mask 320 is projected onto the plate 340 after reflected by the projection optical system 330. The mask 320 and plate 340 are arranged optically conjugate with each other. The step-and-scanner exposure apparatus 300 scans the mask 320 and plate 340 and transfers a pattern on the mask 320 onto the plate 340.

The mask stage 325 supports the mask 320 via the mask chuck 325a and is connected to a moving mechanism (not shown). The mask stage 325 may use any structure known in the art. The moving mechanism (not shown) may include a linear motor etc., and drives the mask stage 125 at least in an X direction, and moves the mask 320. The exposure apparatus 300 synchronously scans the mask 320 and the plate 340. The scanning direction is the X direction on the surface of the mask 320 or the plate 340. A direction perpendicular to the X direction is Y. A direction perpendicular to the surface of the mask 320 or the plate 340 is Z.

The reflection-type projection optical system 130 uses plural multilayer mirrors 330a to project a reduced size of a pattern of the reflection mask 320 onto the plate 340 located at the image plane. The number of multilayer mirrors is about four to six. The multilayer mirror 330a has a convex or concave spherical or aspheric reflecting surface. For wide exposure area with the small number of mirrors, the mask 320 and plate 340 are simultaneously scanned to transfer a wide area that is an arc-shaped area or ring field apart from the optical axis by a predetermined distance. The projection optical system 330 has a NA of about 0.1 to 0.3.

The plate 340 is a wafer in this embodiment, but may cover a LCD and another object to be exposed. A photoresist is applied onto the plate 340.

The plate 340 is supported by the wafer stage 345 via a wafer chuck 345a. The wafer stage 345 uses, for example, a linear motor to move the plate 340 in XYZ directions. The mask 320 and plate 340 are scanned synchronously. The positions of the mask stage 325 and wafer stage 345 are monitored, for example, by a laser interferometer and the like, so that both are driven at a constant speed ratio.

The alignment detection system 350 includes an Off-axis image processing detection system of an off-axis bright field illumination, and provides a wafer alignment while maintaining the predetermined baseline amount. The wafer alignment includes a positional relationship between a position of the mask 320 and an optical axis of the projection optical system 330, and a positional relationship between a position of the plate 340 and an optical axis of the projection optical system 330. The alignment detection system 350 is arranged in the vacuum atmosphere VC and the air atmosphere via a viewing window VW that isolates the vacuum atmosphere VC from the air atmosphere. The inventive imaging optical system 100 is applicable to an optical system in the alignment detection system 350, which is arranged in the vacuum atmosphere VC. Thereby, the alignment detection system 350 can reduce the optical characteristic fluctuation of the optical system to the environmental change, maintaining the high precise detection. The configuration that concretely applies the imaging optical system 100 to the alignment detection system 350 is similar to the focus position detection system, which will be described later, and a detailed description will be omitted.

The focus position detection system 360 measures a position of the plate 340 in the Z direction, controls a position and angle of the wafer stage 345, and always maintains a surface of the plate 340 at an imaging position of the projection optical system 330 during exposure. Similar to the alignment detection system 350, the focus position detection system 360 is arranged in both the vacuum atmosphere VC and the air atmosphere via the viewing window VW. An optical system of the focus position detection system 360 can use the inventive imaging optical system 100. Thereby, even when the optical system is assembled and adjusted in the air atmosphere, then installed in the exposure apparatus 300, and the surrounding atmosphere turns to the vacuum atmosphere, the optical system can maintain the optical characteristic that is available in the air atmosphere.

Figure 6:
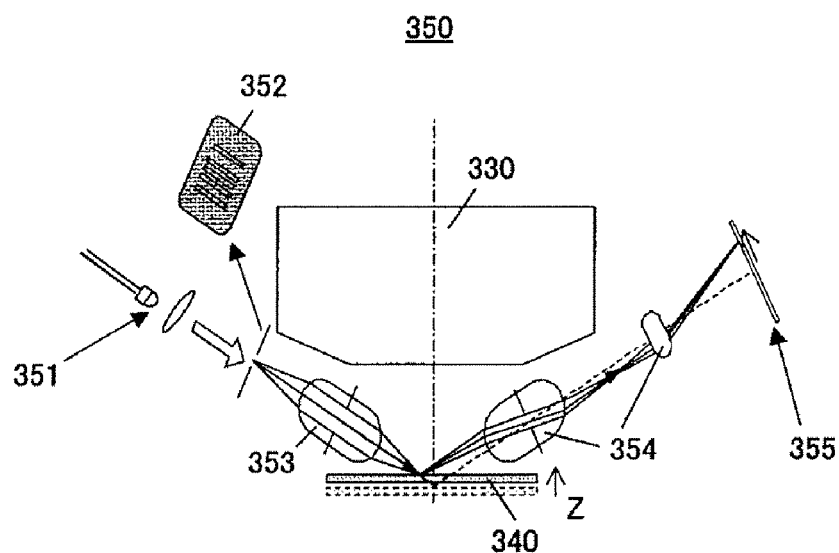
FIG. 6 is a schematic sectional view showing a structure of a focusing position detection system shown in FIG. 5.

A description will now be given of a concrete structure of the focus position detection system 360 that applies the imaging optical system 100. FIG. 6 is a schematic sectional view showing a structure of the focus position detection system 360. The focus position detection system 360 includes an LED light source 361, a mark 362, a projection optical unit 363, a detection optical unit 364, and a CCD 365. The projection optical unit 363 and the detection optical unit 364 are arranged in the vacuum atmosphere.

Referring to FIG. 6, the illumination light from the LED light source 361 illuminates the mark 362, and the projection optical unit 363 projects an image of the mark 362 onto the plate 340. The detection optical unit 354 images the light reflected from the plate 340 onto the CCD 365. This embodiment contemplates an application of the imaging optical system 100 to the detection optical unit 354. Of course, the imaging optical system 100 that is optimized in magnification etc. is also applicable to the projection optical unit 363.

The EUV light emitted from the illumination apparatus 310 illuminates the mask 320. The patter of the mask 320 is imaged on the plate 340 via the projection optical system 330. The exposure area on the image plane has an arc or ring shape in this embodiment. The entire surface of the mask 320 is exposed when the mask 320 and the plate 340 are scanned at a speed ratio corresponding to a reduction ratio. The exposure apparatus 300 uses the imaging optical system 100 for the alignment detection system 350 and the focus position detection system 360, and can detect the alignment and focus position at a precision equivalent to that in the air atmosphere. Thus, the exposure apparatus 300 can provide a higher quality device, such as a semiconductor device, an LCD device, and an image sensor (e.g., a CCD), than ever.

Figure 7:
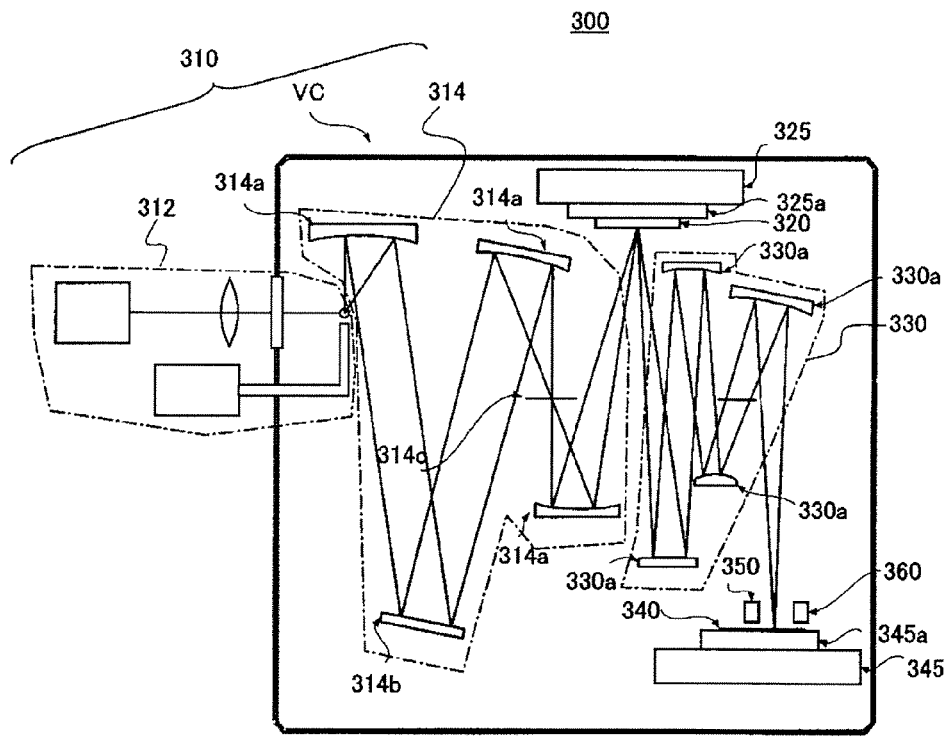
FIG. 7 is a schematic sectional view showing another structure of an exposure apparatus according to one aspect of the present invention.

While this embodiment arranges the alignment detection system 350 and the focus position detection system 360 in the vacuum atmosphere VC and the air atmosphere, the similar effects can be obtained when the alignment detection system 350 and the focus position detection system 360 are provided in the vacuum atmosphere VC, as shown in FIG. 7. Here, FIG. 7 is a schematic sectional view showing another structure of the exposure apparatus 300 according to another aspect of the present invention.

Figure 8:
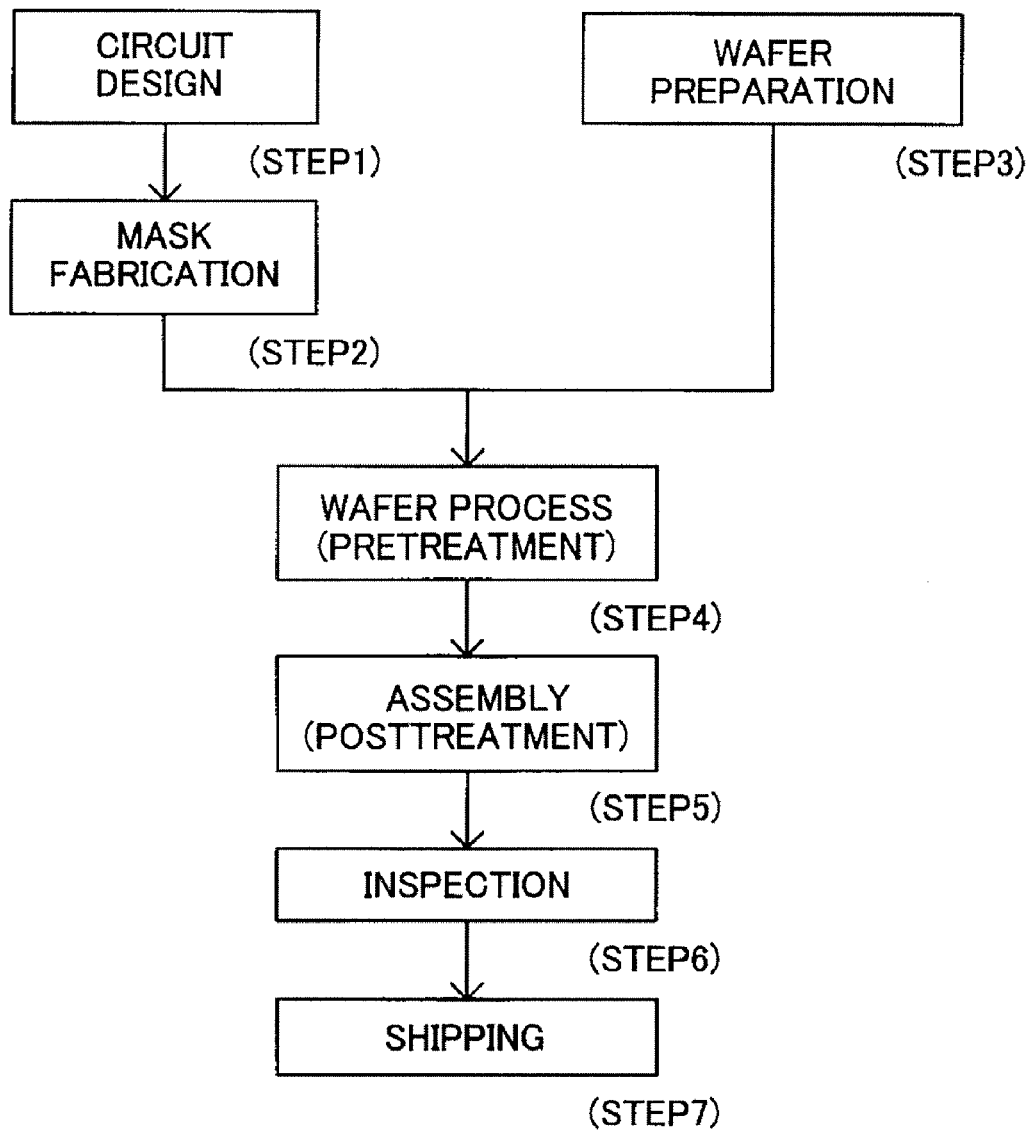
FIG. 8 is a flowchart for explaining a manufacture of a device (such as a semiconductor chip, e.g., ICs and LSIs, an LCD, a CCD).
Figure 9:
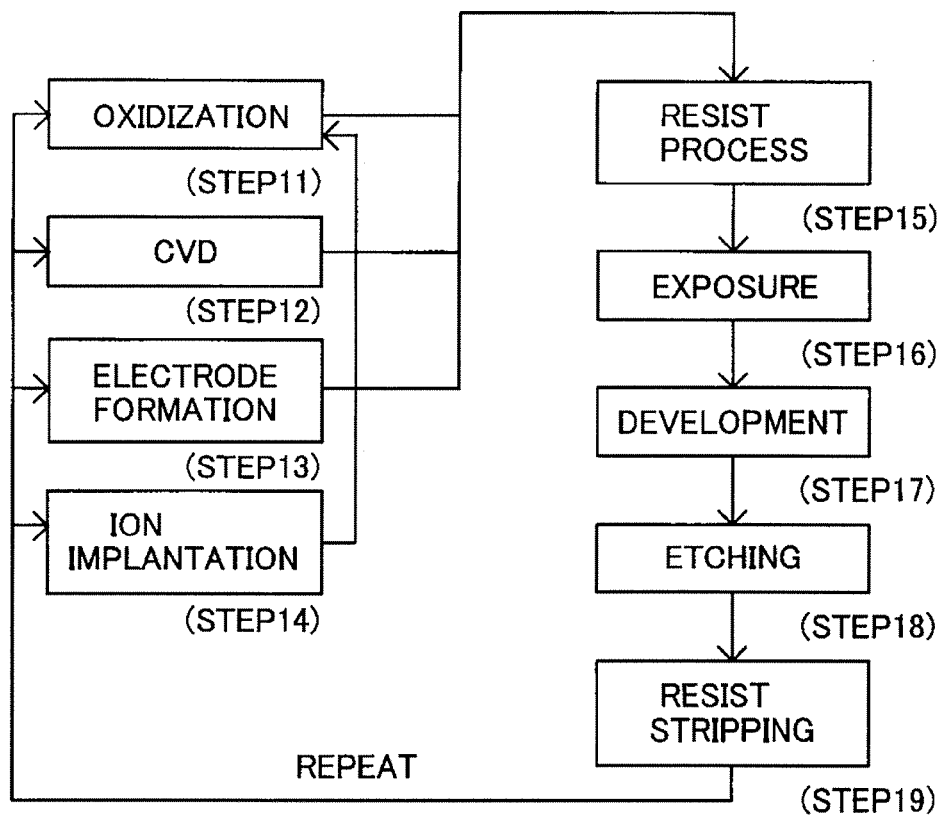
FIG. 9 is a detailed flowchart of wafer process in step 4 shown in FIG. 8.

Referring to FIGS. 8 and 9, a description will now be given of an embodiment of a device manufacturing method using the exposure apparatus 300. FIG. 8 is a flowchart for explaining a fabrication of devices (i.e., semiconductor chips such as IC and LSI, LCDs, CCDs). Here, a description will be given of the fabrication of a semiconductor chip as an example. Step 1 (circuit design) designs a semiconductor device circuit. Step 2 (mask fabrication) forms a mask having a designed circuit pattern. Step 3 (wafer preparation) makes a wafer of a material such as silicon. Step 4 (wafer process), which is also referred to as a pretreatment, forms actual circuitry on the wafer through the photolithography using the mask and wafer. Step 5 (assembly), which is also referred to as a post-treatment, forms into a semiconductor chip the wafer formed in step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

FIG. 9 is a detailed flowchart of the wafer process in Step 4. Step 11 (oxidation) oxidizes the wafer's surface. Step 12 (CVD) forms an insulating film on the wafer's surface. Step 13 (electrode formation) forms electrodes on the wafer by the vapor disposition and the like. Step 14 (ion implantation) implants ions into the wafer. Step 15 (resist process) applies a photosensitive material onto the wafer. Step 16 (exposure) uses the exposure apparatus 300 to expose a circuit pattern of the mask onto the wafer. Step 17 (development) develops the exposed wafer. Step 18 (etching) etches part other than a developed resist image. Step 19 (resist stripping) removes disused resist after etching. These steps are repeated, forming multilayer circuit patterns on the wafer. The device manufacturing method can manufacture higher quality devices than ever. The device manufacturing method using the exposure apparatus 300, and resultant devices form one aspect of the present invention.

Further, the present invention is not limited to these preferred embodiments, and various variations and modifications may be made without departing from the spirit and scope of the present invention. For example, the present invention is applicable to an optical system for use in the vacuum atmosphere as well as the EUV exposure apparatus.

This application claims a foreign priority benefit based on Japanese Patent Applications No. 2005-198541, filed on Jul. 7, 2005, which is hereby incorporated by reference herein in its entirety as if fully set forth herein.

What is claimed is:

1. An imaging optical system for imaging a pattern of an object plane onto an image plane, said imaging optical system comprising:
    a first imaging optical system for forming an intermediate image of the pattern of the object plane; and
    a second imaging optical system for forming an image of the intermediate image,
    wherein when a refractive index of an atmosphere in which said first and second imaging optical systems are placed changes, an object-image distance of one of said first and second imaging optical systems becomes longer, while the object-image distance of the other of said first and second imaging optical systems becomes a shorter.

2. An imaging optical system according to claim 1,
    wherein the first imaging optical system forms the intermediate image at a first imaging position and has a magnification $\alpha$ in a vacuum atmosphere,
    wherein the second imaging optical system forms the image of the intermediate image at a second imaging position and has a magnification $\beta$ in the vacuum atmosphere, and
    wherein when an environment in which the first imaging optical system and the second imaging optical system are placed changes from the vacuum atmosphere to an air atmosphere or vise versa, a direction of the first imaging position that moves along an optical axis is opposite to a direction of the second imaging position that moves along the optical axis.

3. An imaging optical system according to claim 2, wherein when the environment in which said imaging optical system is placed changes from the vacuum atmosphere to the air atmosphere or vise versa, $-2 \times \lambda \times (1/2NA^{IMG})^2 < d3 < 2 \times \lambda \times (1/2NA_{IMG})^2$ is met, where d3 is a changing amount of an imaging position of said imaging optical system along the optical axis, $NA_{IMG}$ is a numeric aperture of said imaging optical system at an image plane side, and $\lambda$ is a wavelength of the light.

4. An imaging optical system according to claim 2, wherein when the environment in which said imaging optical system is placed changes from the vacuum atmosphere to the air atmosphere or vise versa, $|d1|-|d2|\times\alpha^2/(\alpha\times\beta)^2=0$ is met, where d1 is a changing amount of the first imaging position along the optical axis, and d2 is a changing amount of the second imaging position along the optical axis.

5. An imaging optical system according to claim 2, wherein $2<2|\alpha|<|\beta|$ is met.

6. An imaging optical system according to claim 2, wherein when the environment in which said imaging optical system is placed changes from the vacuum atmosphere to an air atmosphere or vise versa, $-(\alpha_{vac}\times\beta_{vac})/10 \leq (\alpha_{vac}\times\beta_{vac}) - (\alpha_{air}\times\beta_{air}) \leq (\alpha_{vac}\times\beta_{vac})/10$ is met, where $(\alpha_{vac}\times\beta_{vac})$ is a magnification of said imaging optical system in the vacuum atmosphere, and $(\alpha_{air}\times\beta_{air})$ is a magnification of said imaging optical system in the air atmosphere.

7. An imaging optical system according to claim 2, wherein when the environment in which said imaging optical system is placed changes from the vacuum atmosphere to the air atmosphere or vise versa, both $|WA_{vac}| \leq \lambda/4$ and $|WA_{air}| \leq \lambda/4$ are met, where $WA_{vac}$ is a wavefront aberration of said imaging optical system on the image plane in the vacuum atmosphere, $WA_{air}$ is a wavefront aberration of said imaging optical system on the image plane in the air atmosphere, and $\lambda$ is a wavelength of the light.

8. An imaging optical system according to claim 2, wherein said first and second imaging optical systems are made of glass materials having such dispersive powers that both a changing amount d1 of the first imaging position of said first imaging optical system in an optical axis direction and a changing amount d2 of the second imaging position of said second imaging optical system in an optical axis direction change in opposite directions.

9. An imaging optical system according to claim 1,
wherein the first imaging optical system has a positive refractive index, and includes a first positive lens with a flat surface facing the object plane, a second positive lens with a convex surface facing the object plane, a third negative lens with a concave surface facing the object plane, a forth positive lens with a convex surface facing the object plane, and a fifth negative lens with a concave surface facing the object plane, and
wherein the second imaging optical system includes a sixth positive lens with a flat surface facing the object plane, a seventh meniscus negative lens with a convex surface facing the object plane, and an eighth positive lens with a convex surface facing the object plane.

10. An exposure apparatus for exposing a plate using a pattern of a mask and a light from a light source, said exposure apparatus comprising:
a first detection optical system for detecting a surface position of the plate; and
a second detection optical system for detecting a relative position between the mask and the plate,
wherein at least one of said first and second detecting optical systems includes an imaging optical system according to claim 1.

* * * * *